(12) United States Patent
Saglam et al.

(10) Patent No.: US 11,971,443 B2
(45) Date of Patent: Apr. 30, 2024

(54) ACTIVE SYMMETRIZATION VIA INSULATION MONITORING FOR ELECTRICAL VEHICLE INTEROPERABILITY WITH CHARGING STATIONS

(71) Applicant: Volvo Car Corporation, Gothenburg (SE)

(72) Inventors: Ustun Saglam, Gothenburg (SE); Narendar Rao Gannamaneni, Gothenburg (SE)

(73) Assignee: VOLVO CAR CORPORATION, Gothenburg (SE)

( * ) Notice: Subject to any disclaimer, the term of this patent is extended or adjusted under 35 U.S.C. 154(b) by 109 days.

(21) Appl. No.: 17/651,496

(22) Filed: Feb. 17, 2022

(65) Prior Publication Data
US 2022/0283216 A1 Sep. 8, 2022

Related U.S. Application Data

(60) Provisional application No. 63/157,218, filed on Mar. 5, 2021.

(51) Int. Cl.
*G01R 31/12* (2020.01)
*B60L 53/22* (2019.01)
(Continued)

(52) U.S. Cl.
CPC .......... *G01R 31/1272* (2013.01); *B60L 53/22* (2019.02); *B60L 53/62* (2019.02); *H02J 7/00032* (2020.01); *B60L 2210/14* (2013.01)

(58) Field of Classification Search
CPC .. G01R 31/1272; G01R 31/40; G01R 31/006; G01R 31/52; B60L 53/22; B60L 53/62;
(Continued)

(56) References Cited

U.S. PATENT DOCUMENTS 5,675,239 A 10/1997 Kim et al.
2013/0314097 A1 11/2013 Hausberger et al.
(Continued)

FOREIGN PATENT DOCUMENTS

DE 10 2019 202 892 A1 9/2020

OTHER PUBLICATIONS

Notice of Allowance received for European Patent Application Serial No. 22160006.7, dated Apr. 25, 2023, 42 pages.
(Continued)

*Primary Examiner* — Paul Dinh
(74) *Attorney, Agent, or Firm* — Amin, Turocy & Watson, LLP

(57) ABSTRACT

An electric vehicle charging system is provided. In some embodiments, the electric vehicle charging system can comprise an electric vehicle comprising a direct current to direct current (DC-DC) booster that boosts a first voltage to a second voltage of a battery of the electric vehicle, and a first insulation monitoring device (IMD) comprising an active symmetrization circuit. In various embodiments, the electric vehicle charging system can further comprise an electric vehicle supply equipment comprising a second IMD and an output voltage comprising the first voltage, wherein the first IMD is communicatively coupled to the second IMD, and wherein the first IMD adjusts a third voltage on a negative side of insulation resistance of the electric vehicle to a fourth voltage on a negative side of insulation resistance of the electric vehicle supply equipment.

20 Claims, 10 Drawing Sheets

(51) Int. Cl.
*B60L 53/62* (2019.01)
*H02J 7/00* (2006.01)

(58) Field of Classification Search
CPC ...... B60L 2210/14; B60L 53/20; B60L 58/20; B60L 2270/20; B60L 53/66; B60L 3/0069; H02J 7/00032; H02M 1/32; H02M 3/157
USPC .......................................................... 320/109
See application file for complete search history.

(56) References Cited

U.S. PATENT DOCUMENTS

| | | |
|---|---|---|
| 2019/0146040 A1 | 5/2019 | Murakami et al. |
| 2020/0200833 A1 | 6/2020 | Mayer et al. |
| 2022/0402390 A1* | 12/2022 | Smolenaers ............ B60L 53/22 |

OTHER PUBLICATIONS

Extended European Search Report received for E.P Patent Application Serial No. 22160006.7 dated Jun. 9, 2022, 11 pages.
"Electric vehicle conductive charging system—Part 23: DC electric vehicle charging station", IEC 61851-23:2014, IEC, 3, Rue De Varembe, PO Box 131, Ch-1211 Geneva 20, Switzerland, Mar. 11, 2014, 164 pages.
Decision to grant a European patent pursuant to Article 97(1) EPC dated Aug. 31, 2023 for EP Application No. 22160006.7.

* cited by examiner

ACTIVE SYMMETRIZATION VIA INSULATION MONITORING FOR ELECTRICAL VEHICLE INTEROPERABILITY WITH CHARGING STATIONS

CROSS-REFERENCE TO RELATED APPLICATION

This application claims priority to U.S. Provisional Patent Application No. 63/157,218, filed on Mar. 5, 2021, and entitled "ACTIVE SYMMETRIZATION VIA INSULATION MONITORING DEVICE IN 800V ELECTRICAL VEHICLE FOR INTEROPERABILITY WITH 400V CHARGING STATIONS," the entirety of which application is hereby incorporated by reference herein.

TECHNICAL FIELD

The disclosed subject matter relates to electric vehicle charging, and more particularly, to active symmetrization via insulation monitoring for electrical vehicle interoperability with charging stations.

BACKGROUND

Electric vehicles (EVs) are becoming increasingly prevalent worldwide, and are poised to become one of the most common modes of transportation. EVs are beginning to utilize increasingly high voltage batteries, such as 800 volt batteries, however, most existing charging equipment utilizes 400 volts or fewer. Therefore, some electric vehicles boost charging equipment voltage to EV battery voltage. However, the foregoing can lead to one or more insulation faults. For example, a symmetrical fault can occur when there is a resistive path to earth comprising approximately the same resistance below the limit specified in the particular standard from all phase conductors. An asymmetrical fault can occur when there is resistive path to earth comprising different resistances below the limit specified in the particular standard from the phase conductors to earth.

Further, unless a corresponding boost operation is galvanically isolated, one or more insulation monitoring issues can arise. For example, while 400 volt charging equipment is monitoring insulation resistances, and a connection made with an EV that utilizes an 800 volt battery, asymmetry of voltage sharing can occur on the insulation resistances. This asymmetry can lead to errors in calculation of insulation resistances, potentially damaging the charging equipment.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. As described, there exists a need for a system that monitors insulation resistances and accordingly balances system voltages, and various embodiments are described herein to this end and/or other ends.

According to an embodiment, an electric vehicle can comprise a direct current to direct current (DC-DC) booster that boosts a first voltage of a charging station to a second voltage of a battery of the electric vehicle; and a first insulation monitoring device (IMD) comprising an active symmetrization circuit, wherein the first IMD is communicatively coupled to a second IMD of the charging station, and wherein the first IMD adjusts a third voltage on a negative side of insulation resistance of the electric vehicle to a fourth voltage on a negative side of insulation resistance of the charging station.

According to another embodiment, an electric vehicle charging system can comprise an electric vehicle comprising a direct current to direct current (DC-DC) booster that boosts a first voltage to a second voltage of a battery of the electric vehicle, and a first insulation monitoring device (IMD) comprising an active symmetrization circuit; and an electric vehicle supply equipment comprising a second IMD and an output voltage comprising the first voltage, wherein the first IMD is communicatively coupled to the second IMD, and wherein the first IMD adjusts a third voltage on a negative side of insulation resistance of the electric vehicle to a fourth voltage on a negative side of insulation resistance of the electric vehicle supply equipment.

According to an additional embodiment, a method can comprise determining, by an insulation monitoring device comprising a processor, of an electric vehicle, a difference between a voltage of a negative side of insulation resistance of an electric vehicle supply equipment (EVSE) and a voltage of a negative side of insulation resistance of the electric vehicle; and in response to determining the difference, balancing, by the insulation monitoring device, the voltage of the negative side of insulation resistance of the EVSE and the voltage of the negative side of insulation resistance of the electric vehicle.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

It will be understood that when an element is referred to as being "coupled" to another element, it can describe one or more different types of coupling including, but not limited to, chemical coupling, communicative coupling, capacitive coupling, electrical coupling, electromagnetic coupling, inductive coupling, operative coupling, optical coupling, physical coupling, thermal coupling, and/or another type of coupling. As referenced herein, an "entity" can comprise a human, a client, a user, a computing device, a software application, an agent, a machine learning model, an artificial intelligence, and/or another entity. It should be appreciated that such an entity can facilitate implementation of the subject disclosure in accordance with one or more embodiments the described herein.

Figure 1:
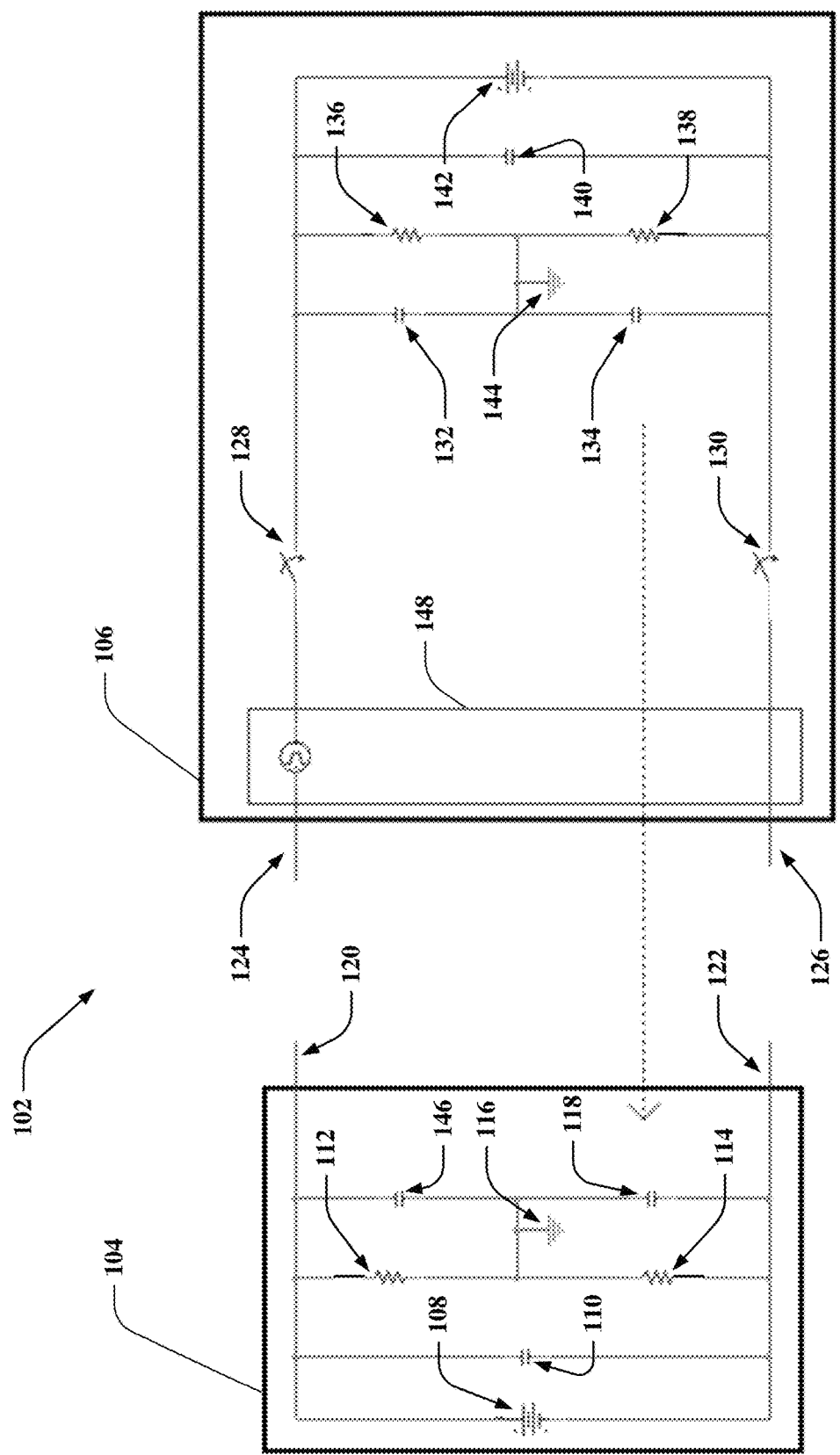
FIG. 1 illustrates a block diagram of an example, non-limiting electric vehicle charging system in accordance with one or more embodiments described herein.

Turning now to FIG. 1, there is illustrated a block diagram of an example, non-limiting electric vehicle charging system 102 in accordance with one or more embodiments described herein. In various embodiments, the electric vehicle charging system 102 can comprise a charging station 104 (e.g., electric vehicle supply equipment (EVSE)) and/or an electric vehicle (EV) 106. In various embodiments, the charging station 104 can comprise one or more of a positive connection 120, negative connection 122, resistor 112, resistor 114, supply voltage 108, capacitor 110, capacitor 146, capacitor 118, and/or ground 116. In one or more embodiments, the EV 106 can comprise one or more of a positive connection 124, negative connection 126, direct current to direct current (DC-DC) converter 148 (e.g., a DC voltage booster), contactor 128, contactor 130, ground 144, capacitor 132, capacitor 134, resistor 136, resistor 138, capacitor 140, and/or battery 142.

In various embodiments, one or more of the charging station 104, EV 106, positive connection 120, negative connection 122, resistor 112, resistor 114, supply voltage 108, capacitor 110, capacitor 146, capacitor 118, ground 116, a positive connection 124, negative connection 126, DC-DC converter 148, contactor 128, contactor 130, ground 144, capacitor 132, capacitor 134, resistor 136, resistor 138, capacitor 140, and/or battery 142 can be communicatively or operably coupled to one another to perform one or more functions of the electric vehicle charging system 102.

Figure 2:
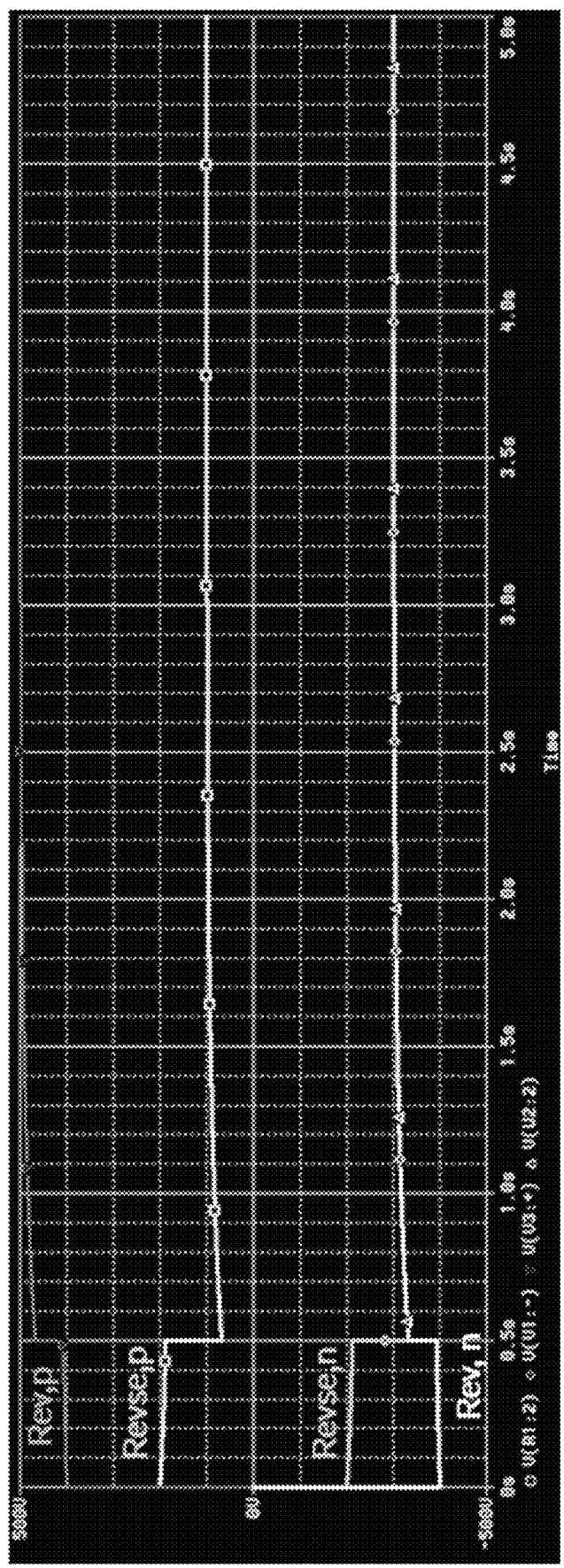
FIG. 2 illustrates a voltage chart in accordance with one or more embodiments described herein.

According to an embodiment, charging station 104 can comprise a 400 volt charging station and battery 142 of the EV 106 can comprise an 800 volt battery, though other suitable voltages for the charging station 104 and EV 106 can be utilized (e.g., in which the battery 142 comprises a higher voltage (e.g., a first voltage) than a voltage (e.g., a second voltage) of the charging station 104). In this regard, supply voltage 108 can comprise 400 volts. Further in this regard, capacitor 146 can comprise 200 volts and capacitor 118 can comprise 200 volts. In one or more embodiments, capacitor 132 can comprise 400 volts and capacitor 134 can comprise 400 volts. In this regard, voltages of insulation resistances (e.g., across resistor 136 and resistor 138) can be equal to each other. Similarly, insulation resistances (e.g., across resistor 112 and resistor 114) can be equal to each other. In this regard, Revse,p can equal Revse,n and Rev,p can equal Rev,n (see, e.g., FIG. 2 as later discussed in greater detail). However, after connection is made between the charging station 104 and EV 106 (e.g., charging cable of charging station 104 is plugged into charging port of EV 106) (e.g., by connecting positive connection 120 to positive connection 124 and negative connection 122 to negative connection 126), voltage sharing can be disrupted. In this regard, voltage across capacitor 132 and/or resistor 136 (e.g., a fifth voltage) (e.g., along positive connection 124) can comprise 100 volts, and voltage across capacitor 134 and resistor 138 (e.g., negative connection 126) can comprise 300 volts. The foregoing can damage the charging station 104. Such voltages are illustrated voltage chart 202 of FIG. 2, in which Rev,p represents voltage across resistor 136, Revse,p represents voltage across resistor 112, Revse,n represents voltage across resistor 114 (e.g., a fourth voltage), and Rev,n represents voltage across resistor 138 (e.g., a third voltage). The voltage values in which Revse,n and Rev,n are balanced can depend on insulation resistance values herein, which can vary due to wear and tear on various components moisture presents, dust presence, or other factors, and can impact such set voltages. The capacitance of one or more capacitors herein (e.g., Y-caps) (e.g., capacitor 110, capacitor 146, capacitor 118, capacitor 132, capacitor 134, and/or capacitor 140) can impact time to reach stable voltages herein.

Figure 3:
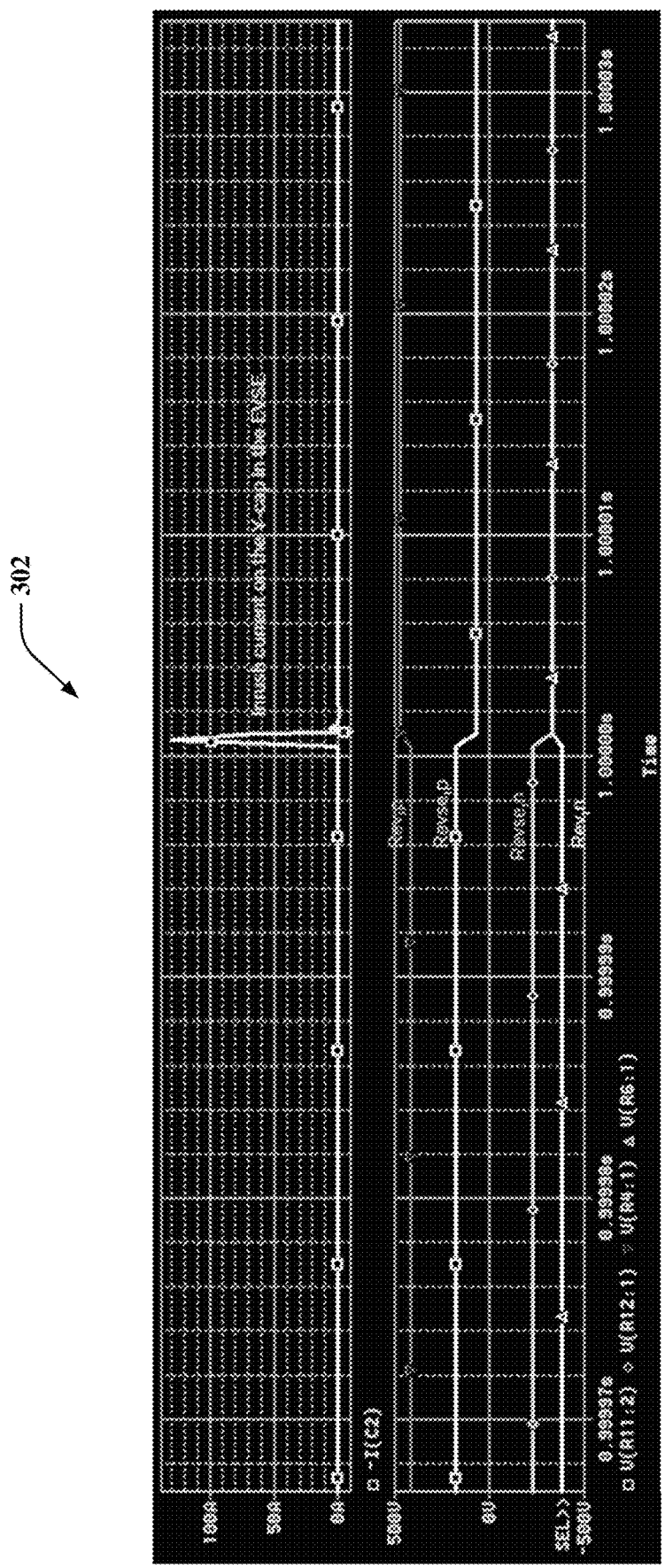
FIG. 3 illustrates a voltage and current chart in accordance with one or more embodiments described herein.

It is noted that insulation resistances herein are not typically fixed. In this regard, insulation resistances can vary over time and/or can depend on presences of moisture, dust, etc. Further in this regard, voltages along a positive connection 124 of the EV 106 (e.g., across capacitor 132 and/or resistor 136) can differ from voltages along the negative connection 126 of the EV 106 (e.g., across capacitor 134 and/or resistor 138). According to an embodiment, if battery 142 comprises 800 volts, capacitor 132 and resistor 136 can experience 200 volts, and capacitor 134 and resistor 138 can experience 600 volts. In this regard Rev,n>Rev,p. In this scenario, if the charging station 104 is connected to the EV 106, damage can occur to the charging station 104 (e.g., to resistor 114 and/or capacitor 118) due to overloading, for example, if the charging station 104 only comprises a 400 volt charging station. In one or more embodiments, the charging station 104 can comprise a maximum output voltage of 500 volts or another suitable voltage rating (e.g., of a 400 volt charging station or another suitable charging station). For example, a 400 volt charging station can comprise a maximum output voltage of 500 volts. In this regard, a high inrush current can flow through a capacitor in the charging station 104 once the EV 106 and charging station 104 are connected. Due to differences in voltage levels, for example, a capacitor of the EV 106 (e.g., capacitor 134), comprising a higher voltage, can attempt to charge another a capacitor of the charging station 104 (e.g., capacitor 118), comprising a lower voltage, which can damage the capacitor 118, capacitor 110, capacitor 118, resistor 114, or another component of the charging station 104. The foregoing is illustrated in chart 302 of FIG. 3, in which inrush current on the Y-cap in the EVSE (e.g., capacitor 118 in the charging station 104) is experienced when a 400 volt EVSE (e.g., charging station 104) is connected to an EV (e.g., EV 106) comprising an 800 volt battery (e.g., battery 142) without symmetrization.

It is noted that in various embodiments, the DC-DC converter 148 can convert or boost a voltage of the charging station (e.g., supply voltage 108) to a voltage of the battery 142 (e.g., of the EV 106).

Figure 4:
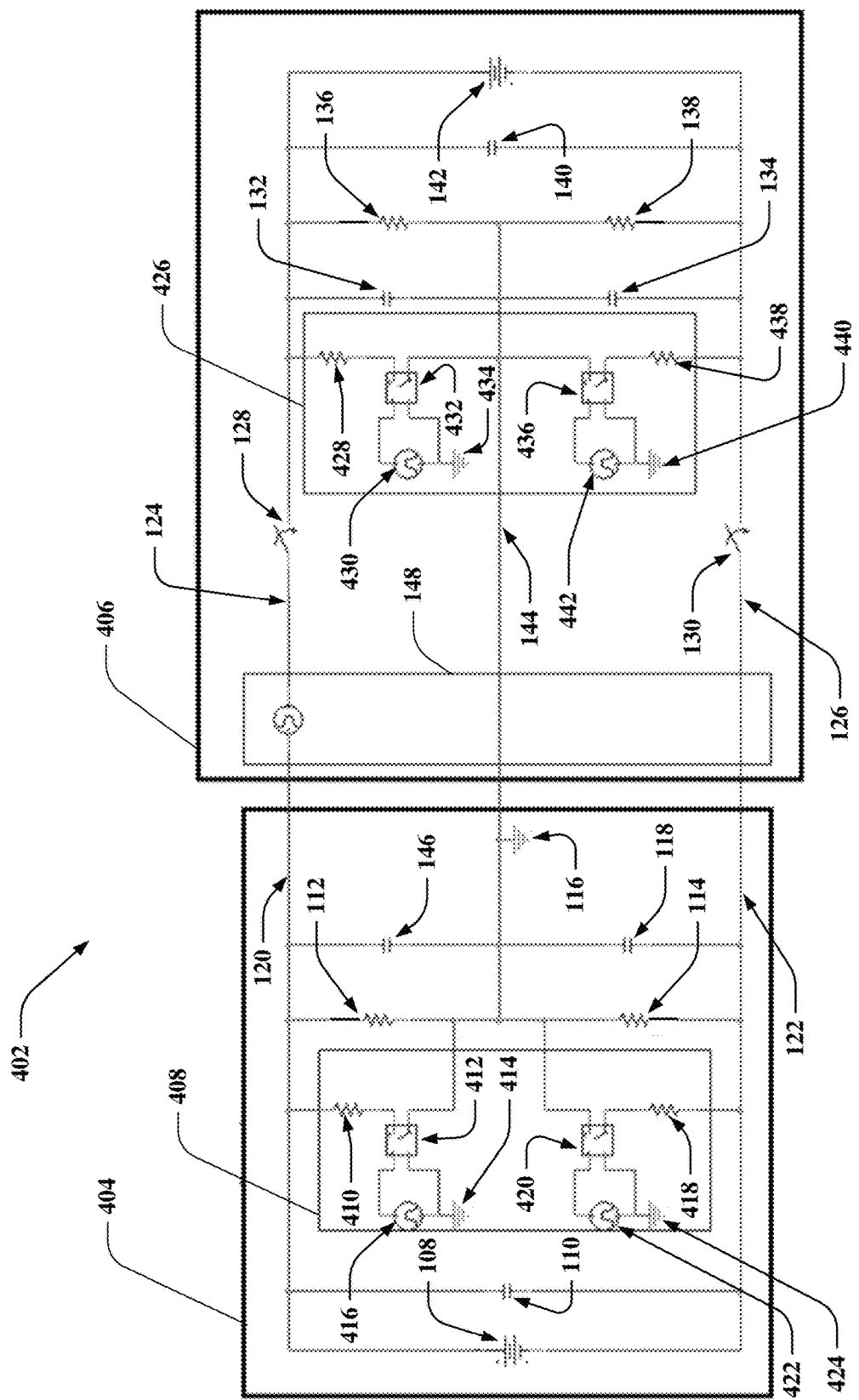
FIG. 4 illustrates a block diagram of an example, non-limiting electric vehicle charging system in accordance with one or more embodiments described herein.

Turning now to FIG. 4, there is illustrated a block diagram of an example, non-limiting electric vehicle charging system 402 in accordance with one or more embodiments described herein. In various embodiments, the electric vehicle charging system 402 can comprise a charging station 404 (e.g., EVSE) and/or an EV 406. In various embodiments, the charging station 404 can comprise one or more of an insulation monitoring device (IMD) 408, positive connection 120, negative connection 122, resistor 112, resistor 114, supply voltage 108, capacitor 110, capacitor 146, capacitor 118, and/or ground 116. In one or more embodiments, the EV 406 can comprise one or more of an IMD 426, positive connection 124, negative connection 126, DC-DC converter 148 (e.g., a DC voltage booster), contactor 128, contactor 130, ground 144, capacitor 132, capacitor 134, resistor 136, resistor 138, capacitor 140, and/or battery 142. In various embodiments, the IMD 408 can comprise a resistor 410, switch 412, sensor 416 (e.g., a voltage sensor, such as a voltmeter), ground 414, switch 420, sensor 422 (e.g., a voltage sensor), ground 424, and/or resistor 418. In one or mor embodiments, the IMD 426 can comprise an active symmetrization circuit, which can comprise one or more of a resistor 428, switch 432, sensor 430 (e.g., a voltage sensor), ground 434, switch 436, sensor 442 (e.g., a voltage sensor), ground 440, and/or resistor 438. Repetitive description of like elements is omitted for sake of brevity.

In various embodiments, one or more of the charging station 404, EV 406, IMD 408, positive connection 120, negative connection 122, resistor 112, resistor 114, supply voltage 108, capacitor 110, capacitor 146, capacitor 118, ground 116, IMD 426, positive connection 124, negative connection 126, DC-DC converter 148, contactor 128, contactor 130, ground 144, capacitor 132, capacitor 134, resistor 136, resistor 138, capacitor 140, battery 142, resistor 410, switch 412, sensor 416, ground 414, switch 420, sensor 422, ground 424, resistor 418, resistor 428, switch 432, sensor 430, ground 434, switch 436, sensor 442, ground 440, and/or resistor 438 can be communicatively or operably coupled to one another to perform one or more functions of the electric vehicle charging system 402.

In various embodiments, insulation monitoring herein can be performed by the IMD 408 and/or IMD 426 (e.g., independently, or collectively). In this regard, during a charging session of the EV 406 by the charging station 404, the IMD 408 can facilitate insulation monitoring, for example, according to a defined charging standard (e.g., Combined Charging System (CCS), CHAdeMO, GB/T, Chaoji, or another suitable charging standard).

It is noted that a symmetrical fault can occur when there is a resistive path to earth comprising approximately the same resistance below the limit specified in the particular standard from all phase conductors. It is further noted that an asymmetrical fault can occur when there is resistive path to earth comprising different resistances below the limit specified in the particular standard from the phase conductors to earth. In this regard, unless a corresponding boost function (e.g., via DC-DC converter 148) is galvanically isolated, accuracies in monitoring of insulation resistances by the IMD 408 can be reduced when the charging station 404 comprises a 400 volt charging station and the battery 142 comprises an 800 volt battery (or with other voltages in which the battery 142 comprises a higher voltage than that of the charging station 404). The foregoing can occur, for example, due to asymmetry of voltage sharing on insulation resistances herein. Such asymmetry can cause the IMD 408 to determine insulation resistances incorrectly.

According to an embodiment, the IMD 426 can be activated to balance voltage sharing herein (e.g., in response to the charging station 404 and EV 406 being connected or communicatively coupled, for example, via the IMD 426 and IMD 408). In various embodiments, the IMD 426 can balance voltage sharing (e.g., between a positive side of insulation resistance of the EV 406 and the negative side of insulation resistance of the EV) by switching the negative side of the resistances periodically (e.g., via opening or closing switch 436 or another suitable switch herein). In this regard, opening or closing switch 436 (e.g., or another suitable switch herein) can disable or enable the resistor 438 (e.g., or another suitable resistor herein) to facilitate balancing of voltage sharing herein (e.g., to increase a voltage of a positive side of insulation resistance and decrease a negative side of insulation resistance of the EV 406 to match the negative voltage of the charging station 404). By balancing voltage sharing (e.g., using the IMD 426), the IMD 408 can be enabled to determine insulation resistances more accurately and/or adjust voltage sharing herein. In various embodiments, the switch 436 (or another switch herein) can be opened or closed according to a defined frequency. In further embodiments, the switch 436 (or another switch herein) can be opened or closed according to a defined duty ratio.

In one or more embodiments, the IMD 426 can be communicatively coupled to the IMD 408 (e.g., via a communication component 512 later discussed in greater detail with respect to FIG. 5). In this regard, the IMD 426 can receive (and/or transmit) data representative of a voltage along the negative connection 122 from the IMD 408 (e.g., and/or transmit or receive other suitable data).

According to an embodiment, contactor 128 and contactor 130 (e.g., a pair of contactors) can be closed (e.g., in response the voltage of the negative side (e.g., along negative connection 122) of insulation resistance of the charging station 404 and the voltage of the negative side (e.g., along negative connection 126) of insulation resistance of the EV 406).

Figure 5:
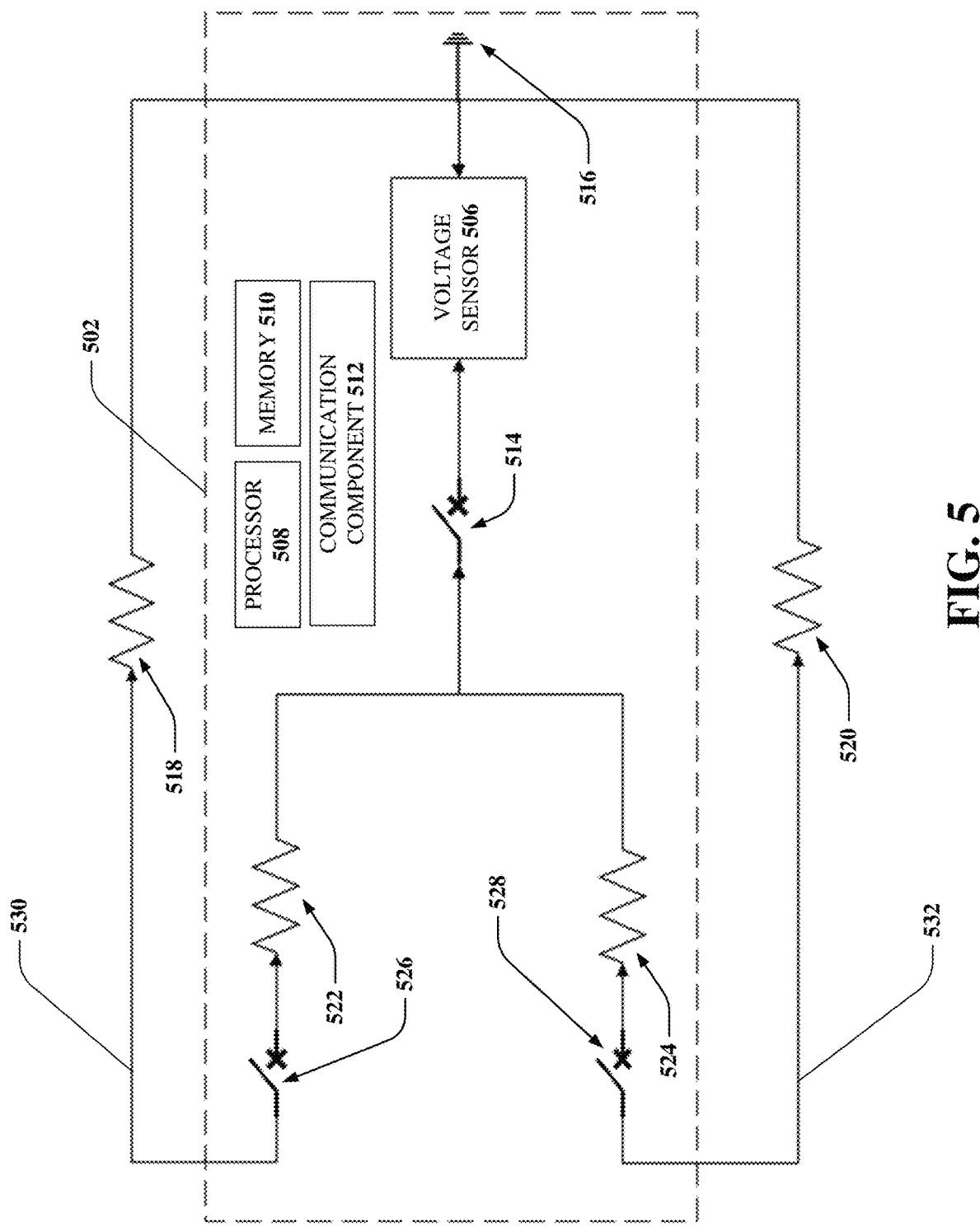
FIG. 5 illustrates a block diagram of an example, non-limiting insulation monitoring device in accordance with one or more embodiments described herein.

FIG. 5 illustrates a block diagram of an example, non-limiting IMD 502 in accordance with one or more embodiments described herein. In various embodiments, IMD 502 can be similar to IMD 408 and/or IMD 426. In one or more embodiments, IMD 502 can comprise an active symmetrization circuit, which can comprise one or more of a voltage sensor 506 (e.g., a voltmeter), processor 508, memory 510, communication component 512, switch 514, ground 516, resistor 522, switch 526, resistor 524, and/or switch 528.

In various embodiments, one or more of the voltage sensor 506, processor 508, memory 510, communication component 512, switch 514, ground 516, resistor 522, switch 526, resistor 524, and/or switch 528 can be communicatively or operably coupled to one another to perform one or more functions of the IMD 502.

According to an embodiment, the IMD 502 can be activated to balance voltage sharing herein. In various embodiments, the IMD 502 can balance voltage sharing by switching the negative side of the resistances periodically (e.g., via opening or closing switch 528 and/or switch 526). In this regard, opening or closing switch 526 or switch 528 can disable or enable the resistor 524 or resistor 522 to facilitate balancing of voltage sharing herein. By balancing voltage sharing (e.g., using the IMD 502 (e.g., a first IMD)), a second IMD can be enabled to determine insulation resistances more accurately and/or adjust the voltage sharing herein. In various embodiments, the switch 528 or the switch 526 can be opened or closed according to a defined frequency. In further embodiments, the switch 528 or the switch 526 can be opened or closed according to a defined duty ratio.

According to an embodiment, resistor 518 can comprise an unknown resistor or an unknown resistance value on a positive line 530 (e.g., a positive arm or positive connection 124), and resistor 520 can comprise an unknown resistor or an unknown resistance value on a negative line 532 (e.g., a negative arm or negative connection 126). The voltage sensor 506 can be utilized to measure voltage across positive line 530 and/or negative line 532. Next, a known resistor (e.g., resistor 522 and/or resistor 524) can be activated (e.g., via closing of switch 526 and/or switch 528, respectively) to measure voltage again. By comparing voltages, insulation resistance herein can be determined (e.g., via determination of voltages on the positive line 530 and/or negative line 532).

It is noted that the processor 508 and/or memory 510 can be utilized to facilitate performance of one or more functions of the IMD 502. Further, the communication component 512 can comprise the hardware required to implement a variety of communication protocols (e.g., infrared ("IR"), short-wave transmission, near-field communication ("NFC"), Bluetooth, Wi-Fi, long-term evolution ("LTE"), 3G, 4G, 5G, global system for mobile communications ("GSM"), code-division multiple access ("CDMA"), satellite, visual cues, radio waves, etc.). In this regard, the communication component 512 can be utilized to communicate with other IMDs (e.g., other than the IMD 502). It is noted that while not depicted, the IMD 408 and/or IMD 426 can similarly comprise a processor 508, memory 510, and/or communication component 512. In this regard, the communication component 512 can be utilized to communicate according to CCS, CHAdeMO, or another suitable standard, with other IMDs or devices.

Figure 6:
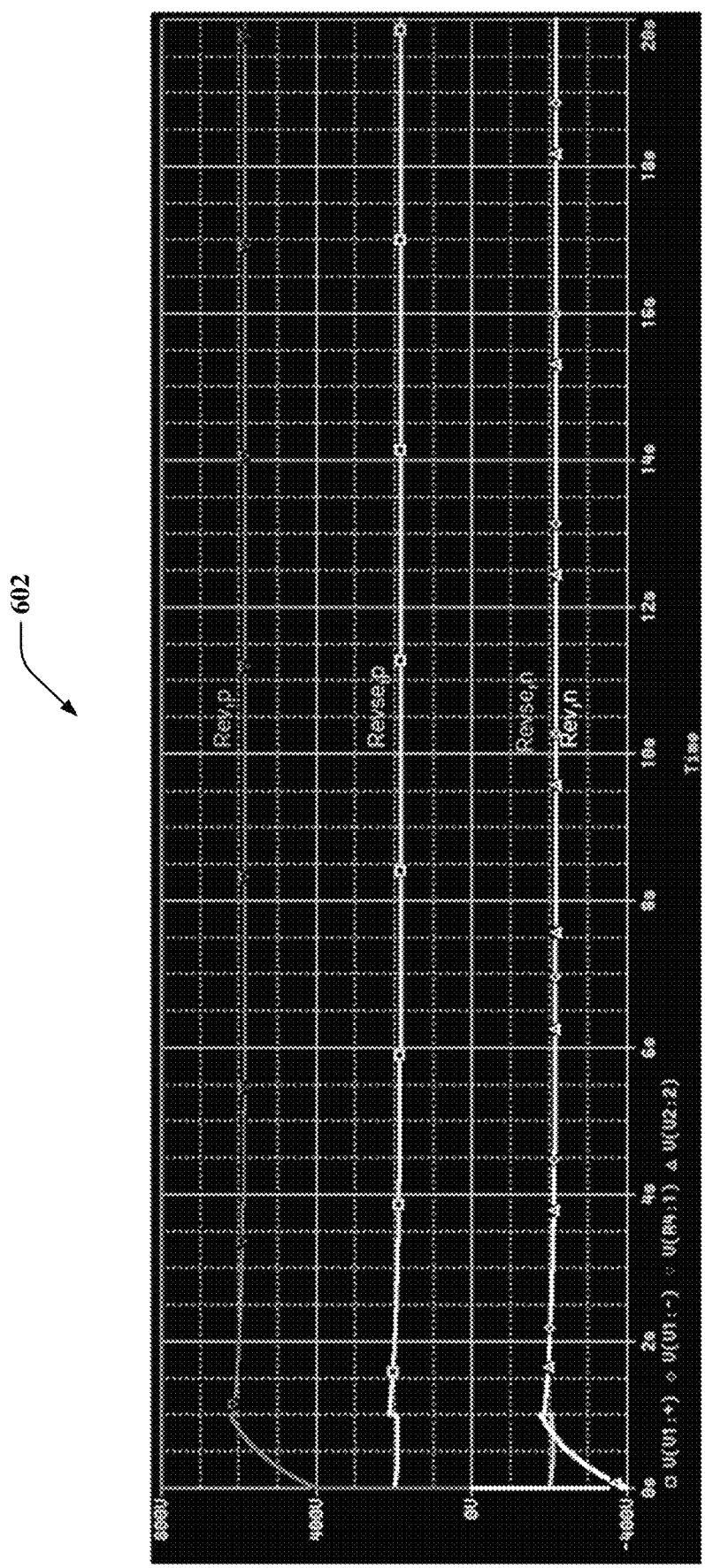
FIG. 6 illustrates a voltage chart in accordance with one or more embodiments described herein.
Figure 7:
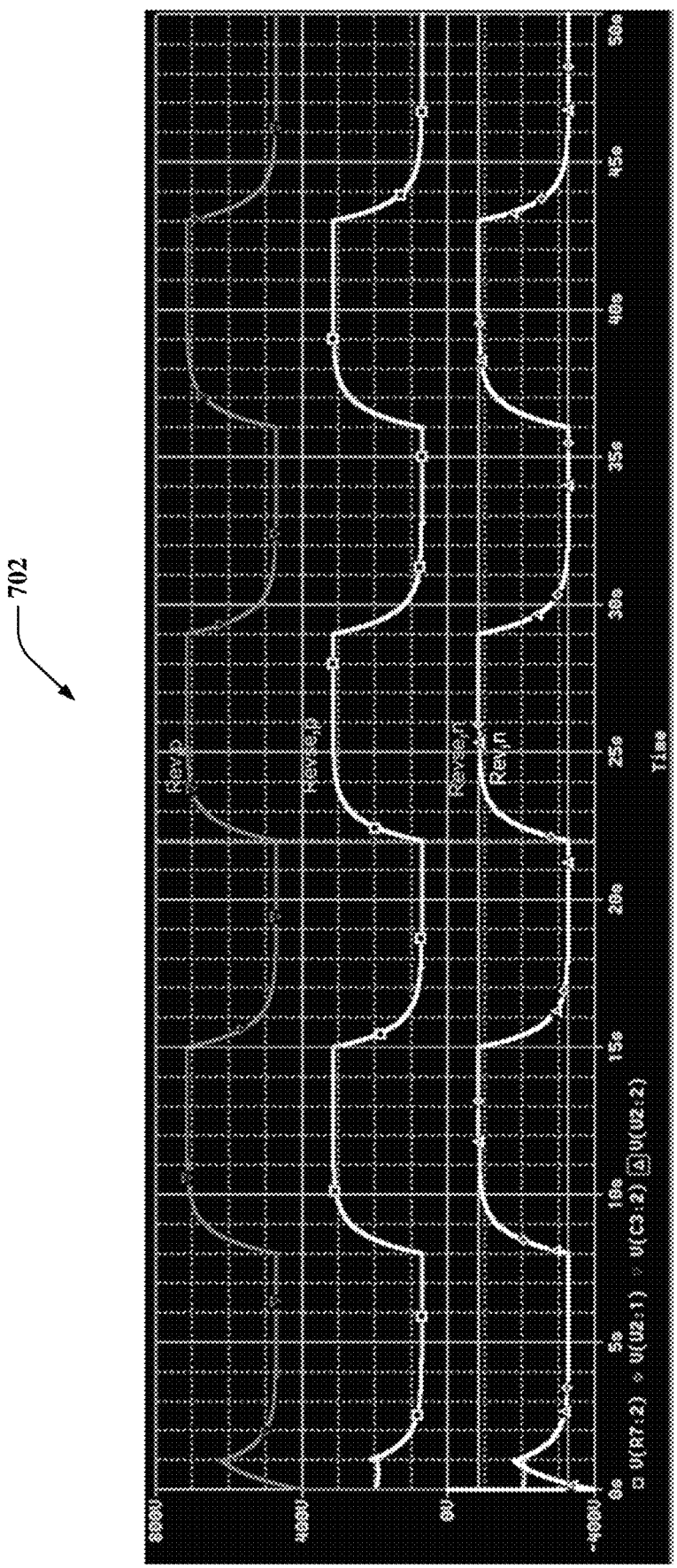
FIG. 7 illustrates a voltage chart in accordance with one or more embodiments described herein.

FIG. 6 illustrates a voltage chart 602 in accordance with one or more embodiments described herein. In this regard, FIG. 6 illustrates a balanced condition (e.g., utilizing IMD 426 for symmetrization) (e.g., between Revse,p and Revse, n). In this regard, the voltage of insulation resistance on a negative side of the EV 406 (e.g., along negative connection 126) can be decreased to match voltage along the negative connection 122 of the charging station 404 (e.g., before a connection is realized at t=1 s, by closing the contactor 128 and/or contactor 130). After contactor 128 and/or contactor 130 (e.g., a pair of contactors) are closed (e.g., charging connection established between the charging station 404 and EV 406), resistor 438 in the IMD 426 can be switched periodically (e.g., via switch 436) to maintain the voltage of along the negative connection 126 or as requested by the IMD 408. FIG. 7 illustrates a voltage chart 702 in accordance with one or more embodiments described herein. According to an embodiment, in voltage chart 702, the depicted voltage waveforms can comprise a result of correct insulation resistance calculation (e.g., by an IMD 408) when the IMD 426 is actively balancing one or more voltages herein (e.g., of one or more capacitors herein).

Figure 8:
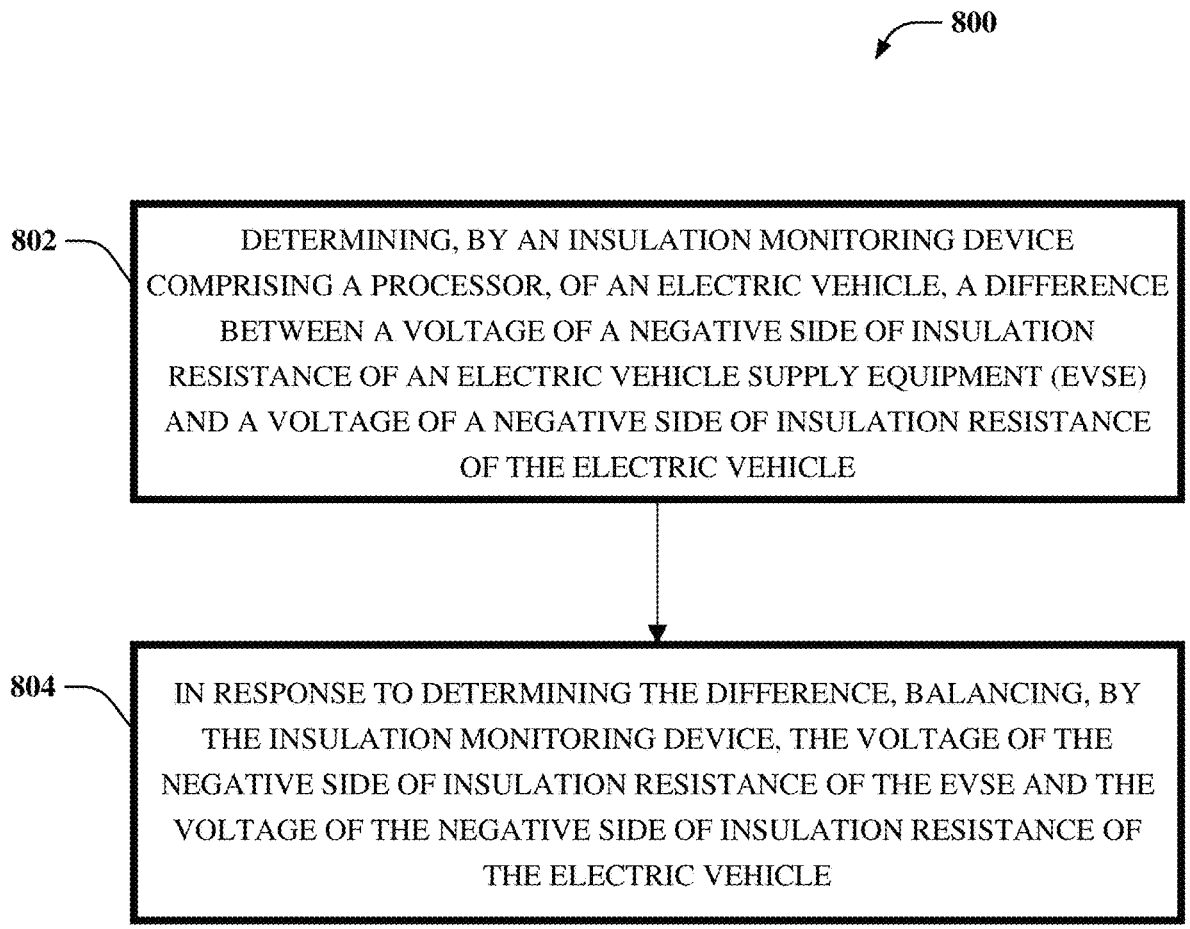
FIG. 8 illustrates a flow diagram of an example, non-limiting balancing process in accordance with one or more embodiments described herein.

FIG. 8 illustrates a flow diagram of an example, non-limiting balancing process 800 in accordance with one or more embodiments described herein. Repetitive description of like elements and/or processes employed in respective embodiments is omitted for sake of brevity. At 802, the process 800 can comprise determining, by an insulation monitoring device (e.g., IMD 426) comprising a processor, of an electric vehicle (e.g., EV 406), a difference between a voltage of a negative side (e.g., negative connection 122) of insulation resistance of an electric vehicle supply equipment (EVSE) (e.g., charging station 404) and a voltage of a negative side (e.g., negative connection 126) of insulation resistance of the electric vehicle. At 804, the process 800 can comprise in response to determining the difference, balancing, by the insulation monitoring device (e.g., IMD 426), the voltage of the negative side (e.g., negative connection 122) of insulation resistance of the EVSE and the voltage of the negative side (e.g., negative connection 126) of insulation resistance of the electric vehicle.

Systems herein can comprise a memory which can store one or more computer/machine readable and/or executable components and/or instructions that, when executed by a processor (e.g., a classical processor, a quantum processor, etc.), can facilitate performance of operations defined by the executable component(s) and/or instruction(s). The memory can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures.

Systems herein can comprise a processor which can comprise one or more types of processors and/or electronic circuitry (e.g., a classical processor, graphics processor, a quantum processor, etc.) that can implement one or more computer and/or machine readable, writable, and/or executable components and/or instructions that can be stored on a memory. For example, the processor can perform various operations that can be specified by such computer and/or machine readable, writable, and/or executable components and/or instructions including, but not limited to, logic, control, input/output (I/O), arithmetic, and/or the like. In some embodiments, processors herein can comprise one or more central processing unit, multi-core processor, microprocessor, dual microprocessors, microcontroller, System on a Chip (SOC), array processor, vector processor, quantum processor, and/or another type of processor.

Systems described herein can be coupled (e.g., communicatively, electrically, operatively, optically, etc.) to one or more local or remote (e.g., external) systems, sources, and/or devices (e.g., electronic control systems (ECU), classical and/or quantum computing devices, communication devices, etc.). For example, systems herein (or other systems, controllers, processors, etc.) can be coupled (e.g., communicatively, electrically, operatively, optically, etc.) to one or more local or remote (e.g., external) systems, sources, and/or devices using a data cable (e.g., High-Definition Multimedia Interface (HDMI), recommended standard (RS), Ethernet cable, etc.) and/or one or more wired networks described below.

In some embodiments, systems herein can be coupled (e.g., communicatively, electrically, operatively, optically, etc.) to one or more local or remote (e.g., external) systems, sources, and/or devices (e.g., electronic control units (ECU), classical and/or quantum computing devices, communication devices, etc.) via a network. In these embodiments, such a network can comprise one or more wired and/or wireless networks, including, but not limited to, a cellular network, a wide area network (WAN) (e.g., the Internet), and/or a local area network (LAN). For example, a system herein can communicate with one or more local or remote (e.g., external) systems, sources, and/or devices, for instance, computing devices using such a network, which can comprise virtually any desired wired or wireless technology, including but not limited to: powerline ethernet, wireless fidelity (Wi-Fi), BLUETOOTH®, fiber optic communications, global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. In this example, systems herein can thus include hardware (e.g., a central processing unit (CPU), a transceiver, a decoder, an antenna (e.g., a ultra-wideband (UWB) antenna, a BLUETOOTH® low energy (BLE) antenna, etc.), quantum hardware, a quantum processor, etc.), software (e.g., a set of threads, a set of processes, software in execution, quantum pulse schedule, quantum circuit, quantum gates, etc.), or a combination of hardware and software that facilitates communicating information between a system herein and remote (e.g., external) systems, sources, and/or devices (e.g., computing and/or communication devices such as, for instance, a smart phone, a smart watch, wireless earbuds, etc.).

Systems herein can comprise one or more computer and/or machine readable, writable, and/or executable components and/or instructions that, when executed by processor (e.g., a classical processor, a quantum processor, etc.), can facilitate performance of operations defined by such component(s) and/or instruction(s). Further, in numerous embodiments, any component associated with a system herein, as described herein with or without reference to the various figures of the subject disclosure, can comprise one or more computer and/or machine readable, writable, and/or executable components and/or instructions that, when executed by a processor, can facilitate performance of operations defined by such component(s) and/or instruction(s). For example, any component associated with systems as disclosed herein (e.g., communicatively, electronically, operatively, and/or optically coupled with and/or employed by a system described herein), can comprise such computer and/or machine readable, writable, and/or executable component(s) and/or instruction(s). Consequently, according to numerous embodiments or systems herein and/or any components associated therewith as disclosed herein, can employ a processor to execute such computer and/or machine readable, writable, and/or executable component(s) and/or instruction(s) to facilitate performance of one or more operations described herein with reference to system herein and/or any such components associated therewith.

Systems herein can comprise any type of system, device, machine, apparatus, component, and/or instrument that comprises a processor and/or that can communicate with one or more local or remote electronic systems and/or one or more local or remote devices via a wired and/or wireless network. All such embodiments are envisioned. For example, a system herein can comprise a computing device, a general-purpose computer, a special-purpose computer, an onboard computing device, a communication device, an onboard communication device, a server device, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Figure 9:
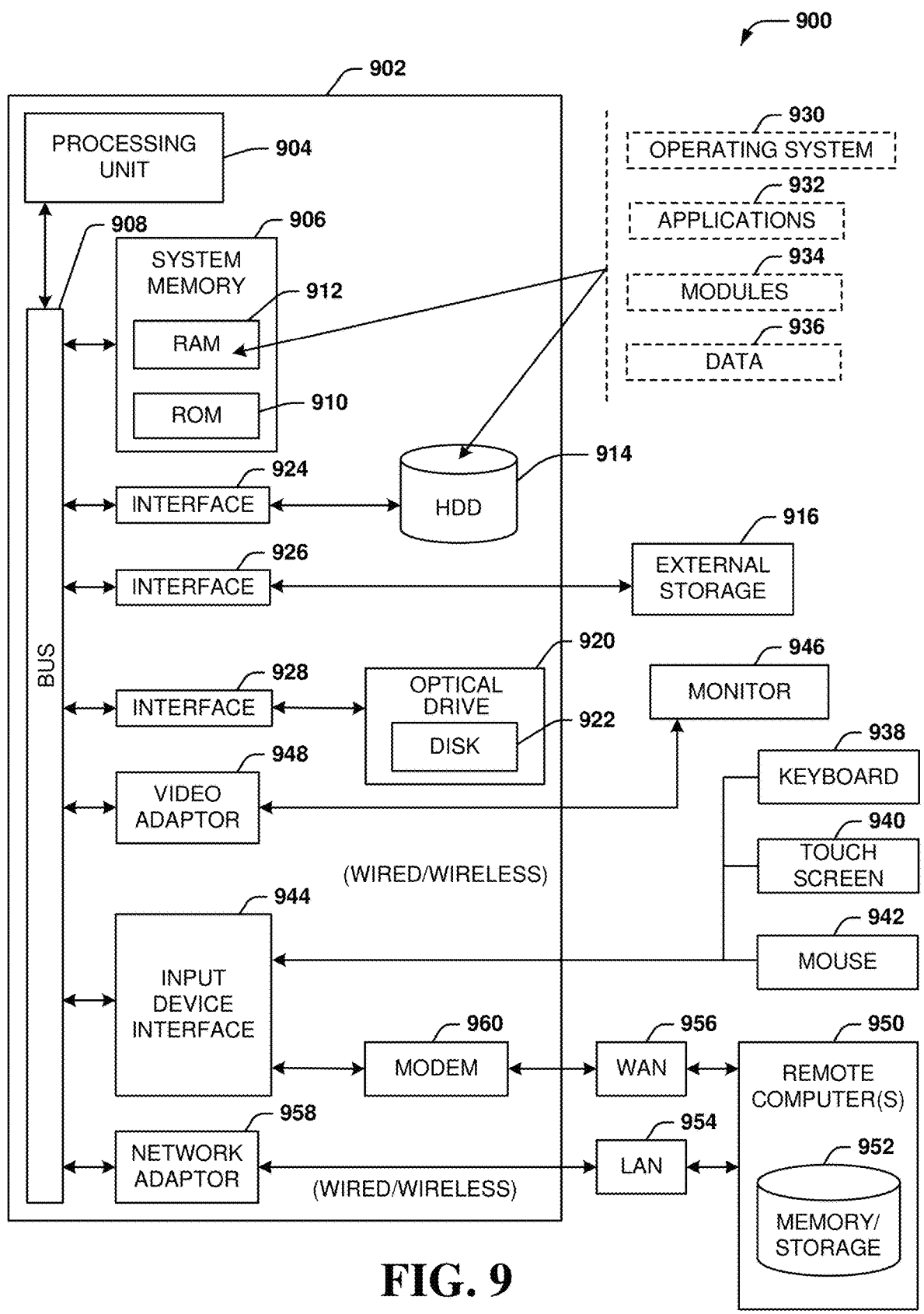
FIG. 9 is an example, non-limiting computing environment in which one or more embodiments described herein can be implemented.

In order to provide additional context for various embodiments described herein, FIG. 9 and the following discussion are intended to provide a brief, general description of a suitable computing environment 900 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data, or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory, or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries, or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 9, the example environment 900 for implementing various embodiments of the aspects described herein includes a computer 902, the computer 902 including a processing unit 904, a system memory 906 and a system bus 908. The system bus 908 couples system components including, but not limited to, the system memory 906 to the processing unit 904. The processing unit 904 can be any of various commercially available processors. Dual microprocessors and other multi-processor architectures can also be employed as the processing unit 904.

The system bus 908 can be any of several types of bus structure that can further interconnect to a memory bus (with or without a memory controller), a peripheral bus, and a local bus using any of a variety of commercially available bus architectures. The system memory 906 includes ROM 910 and RAM 912. A basic input/output system (BIOS) can be stored in a non-volatile memory such as ROM, erasable programmable read only memory (EPROM), EEPROM, which BIOS contains the basic routines that help to transfer information between elements within the computer 902, such as during startup. The RAM 912 can also include a high-speed RAM such as static RAM for caching data.

The computer 902 further includes an internal hard disk drive (HDD) 914 (e.g., EIDE, SATA), one or more external storage devices 916 (e.g., a magnetic floppy disk drive (FDD) 916, a memory stick or flash drive reader, a memory card reader, etc.) and an optical disk drive 920 (e.g., which can read or write from a CD-ROM disc, a DVD, a BD, etc.). While the internal HDD 914 is illustrated as located within the computer 902, the internal HDD 914 can also be configured for external use in a suitable chassis (not shown). Additionally, while not shown in environment 900, a solid-state drive (SSD) could be used in addition to, or in place of, an HDD 914. The HDD 914, external storage device(s) 916 and optical disk drive 920 can be connected to the system bus 908 by an HDD interface 924, an external storage interface 926 and an optical drive interface 928, respectively. The interface 924 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 902, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 912, including an operating system 930, one or more application programs 932, other program modules 934 and program data 936. All or portions of the operating system, applications, modules, and/or data can also be cached in the RAM 912. The systems and methods described herein can be implemented utilizing various commercially available operating systems or combinations of operating systems.

Computer 902 can optionally comprise emulation technologies. For example, a hypervisor (not shown) or other intermediary can emulate a hardware environment for operating system 930, and the emulated hardware can optionally be different from the hardware illustrated in FIG. 9. In such an embodiment, operating system 930 can comprise one virtual machine (VM) of multiple VMs hosted at computer 902. Furthermore, operating system 930 can provide runtime environments, such as the Java runtime environment or the .NET framework, for applications 932. Runtime environments are consistent execution environments that allow applications 932 to run on any operating system that includes the runtime environment. Similarly, operating system 930 can support containers, and applications 932 can be in the form of containers, which are lightweight, standalone, executable packages of software that include, e.g., code, runtime, system tools, system libraries and settings for an application.

Further, computer 902 can be enable with a security module, such as a trusted processing module (TPM). For instance, with a TPM, boot components hash next in time boot components, and wait for a match of results to secured values, before loading a next boot component. This process can take place at any layer in the code execution stack of computer 902, e.g., applied at the application execution level or at the operating system (OS) kernel level, thereby enabling security at any level of code execution.

A user can enter commands and information into the computer 902 through one or more wired/wireless input devices, e.g., a keyboard 938, a touch screen 940, and a pointing device, such as a mouse 942. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 904 through an input device interface 944 that can be coupled to the system bus 908, but can be connected by other interfaces, such as a parallel port, an IEEE 1394 serial port, a game port, a USB port, an IR interface, a BLUETOOTH® interface, etc.

A monitor 946 or other type of display device can be also connected to the system bus 908 via an interface, such as a video adapter 948. In addition to the monitor 946, a computer typically includes other peripheral output devices (not shown), such as speakers, printers, etc.

The computer 902 can operate in a networked environment using logical connections via wired and/or wireless communications to one or more remote computers, such as a remote computer(s) 950. The remote computer(s) 950 can be a workstation, a server computer, a router, a personal computer, portable computer, microprocessor-based entertainment appliance, a peer device or other common network node, and typically includes many or all of the elements described relative to the computer 902, although, for purposes of brevity, only a memory/storage device 952 is illustrated. The logical connections depicted include wired/wireless connectivity to a local area network (LAN) 954 and/or larger networks, e.g., a wide area network (WAN) 956. Such LAN and WAN networking environments are commonplace in offices and companies, and facilitate enterprise-wide computer networks, such as intranets, all of which can connect to a global communications network, e.g., the Internet.

When used in a LAN networking environment, the computer 902 can be connected to the local network 954 through a wired and/or wireless communication network interface or adapter 958. The adapter 958 can facilitate wired or wireless communication to the LAN 954, which can also include a wireless access point (AP) disposed thereon for communicating with the adapter 958 in a wireless mode.

When used in a WAN networking environment, the computer 902 can include a modem 960 or can be connected to a communications server on the WAN 956 via other means for establishing communications over the WAN 956, such as by way of the Internet. The modem 960, which can be internal or external and a wired or wireless device, can be connected to the system bus 908 via the input device interface 944. In a networked environment, program modules depicted relative to the computer 902 or portions thereof, can be stored in the remote memory/storage device 952. It will be appreciated that the network connections shown are example and other means of establishing a communications link between the computers can be used.

When used in either a LAN or WAN networking environment, the computer 902 can access cloud storage systems or other network-based storage systems in addition to, or in place of, external storage devices 916 as described above. Generally, a connection between the computer 902 and a cloud storage system can be established over a LAN 954 or WAN 956 e.g., by the adapter 958 or modem 960, respectively. Upon connecting the computer 902 to an associated cloud storage system, the external storage interface 926 can, with the aid of the adapter 958 and/or modem 960, manage storage provided by the cloud storage system as it would other types of external storage. For instance, the external storage interface 926 can be configured to provide access to cloud storage sources as if those sources were physically connected to the computer 902.

The computer 902 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

Figure 10:
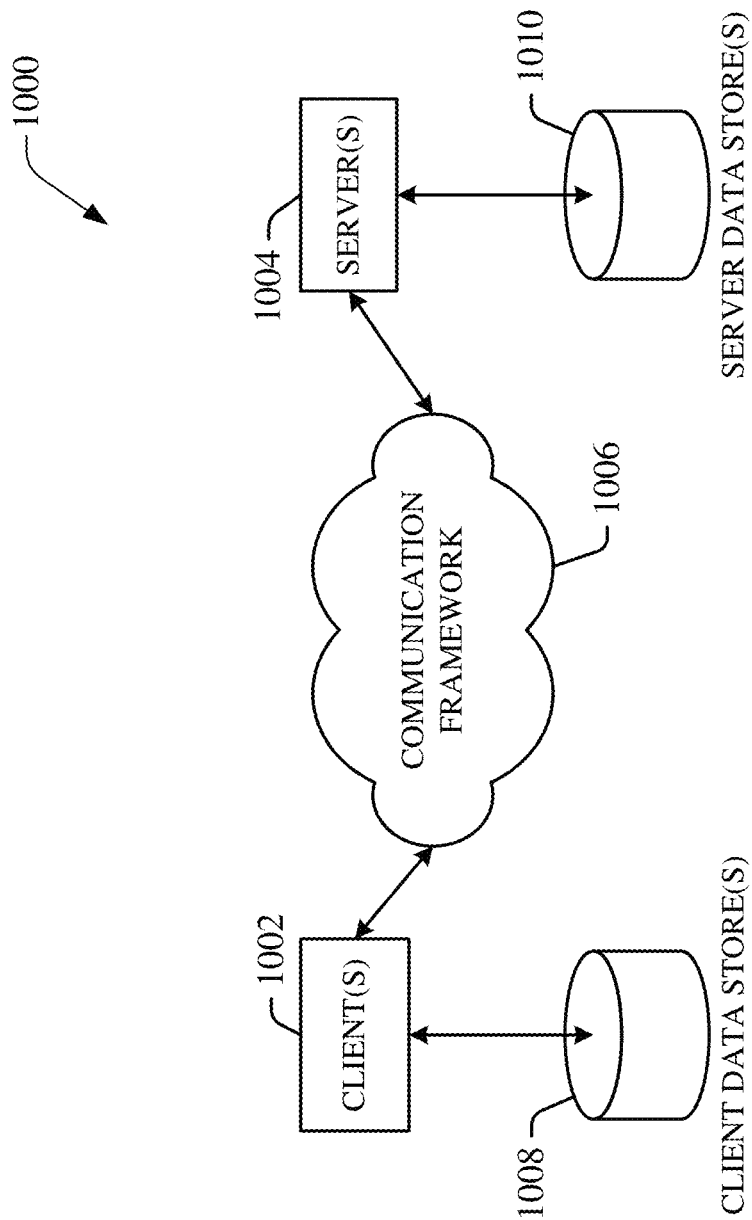
FIG. 10 is an example, non-limiting networking environment in which one or more embodiments described herein can be implemented.

Referring now to FIG. 10, there is illustrated a schematic block diagram of a computing environment 1000 in accordance with this specification. The system 1000 includes one or more client(s) 1002, (e.g., computers, smart phones, tablets, cameras, PDA's). The client(s) 1002 can be hardware and/or software (e.g., threads, processes, computing devices). The client(s) 1002 can house cookie(s) and/or associated contextual information by employing the specification, for example.

The system 1000 also includes one or more server(s) 1004. The server(s) 1004 can also be hardware or hardware in combination with software (e.g., threads, processes, computing devices). The servers 1004 can house threads to perform transformations of media items by employing aspects of this disclosure, for example. One possible communication between a client 1002 and a server 1004 can be in the form of a data packet adapted to be transmitted between two or more computer processes wherein data packets can include coded analyzed headspaces and/or input. The data packet can include a cookie and/or associated contextual information, for example. The system 1000 includes a communication framework 1006 (e.g., a global communication network such as the Internet) that can be employed to facilitate communications between the client(s) 1002 and the server(s) 1004.

Communications can be facilitated via a wired (including optical fiber) and/or wireless technology. The client(s) 1002 are operatively connected to one or more client data store(s) 1008 that can be employed to store information local to the client(s) 1002 (e.g., cookie(s) and/or associated contextual information). Similarly, the server(s) 1004 are operatively connected to one or more server data store(s) 1010 that can be employed to store information local to the servers 1004.

In one exemplary implementation, a client 1002 can transfer an encoded file, (e.g., encoded media item), to server 1004. Server 1004 can store the file, decode the file, or transmit the file to another client 1002. It is to be appreciated, that a client 1002 can also transfer uncompressed file to a server 1004 and server 1004 can compress the file and/or transform the file in accordance with this disclosure. Likewise, server 1004 can encode information and transmit the information via communication framework 1006 to one or more clients 1002.

The illustrated aspects of the disclosure can also be practiced in distributed computing environments where certain tasks are performed by remote processing devices that are linked through a communications network. In a distributed computing environment, program modules can be located in both local and remote memory storage devices.

The above description includes non-limiting examples of the various embodiments. It is, of course, not possible to describe every conceivable combination of components or methods for purposes of describing the disclosed subject matter, and one skilled in the art can recognize that further combinations and permutations of the various embodiments are possible. The disclosed subject matter is intended to embrace all such alterations, modifications, and variations that fall within the spirit and scope of the appended claims.

With regard to the various functions performed by the above-described components, devices, circuits, systems, etc., the terms (including a reference to a "means") used to describe such components are intended to also include, unless otherwise indicated, any structure(s) which performs the specified function of the described component (e.g., a functional equivalent), even if not structurally equivalent to the disclosed structure. In addition, while a particular feature of the disclosed subject matter may have been disclosed with respect to only one of several implementations, such feature can be combined with one or more other features of the other implementations as may be desired and advantageous for any given or particular application.

The terms "exemplary" and/or "demonstrative" as used herein are intended to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent structures and techniques known to one skilled in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

The term "or" as used herein is intended to mean an inclusive "or" rather than an exclusive "or." For example, the phrase "A or B" is intended to include instances of A, B, and both A and B. Additionally, the articles "a" and "an" as used in this application and the appended claims should generally be construed to mean "one or more" unless either otherwise specified or clear from the context to be directed to a singular form.

The term "set" as employed herein excludes the empty set, i.e., the set with no elements therein. Thus, a "set" in the subject disclosure includes one or more elements or entities. Likewise, the term "group" as utilized herein refers to a collection of one or more entities.

The description of illustrated embodiments of the subject disclosure as provided herein, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as one skilled in the art can recognize. In this regard, while the subject matter has been described herein in connection with various embodiments and corresponding drawings, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

Further aspects of the invention are provided by the subject matter of the following clauses:

1. An electric vehicle, comprising:
a direct current to direct current (DC-DC) booster that boosts a first voltage of a charging station to a second voltage of a battery of the electric vehicle; and
a first insulation monitoring device (IMD) comprising an active symmetrization circuit, wherein the first IMD is communicatively coupled to a second IMD of the charging station, and wherein the first IMD adjusts a third voltage on a negative side of insulation resistance of the electric vehicle to a fourth voltage on a negative side of insulation resistance of the charging station.

2. The electric vehicle of any preceding clause, wherein the first IMD and the second IMD communicate according to a defined charging standard.

3. The electric vehicle of any preceding clause, wherein the first IMD receives data indicative of the fourth voltage from the second IMD.

4. The electric vehicle of any preceding clause, wherein the first IMD further comprises a voltage sensor that measures the third voltage.

5. The electric vehicle of any preceding clause, wherein the first IMD further comprises:
a resistor; and
a switch that closes or opens to enable or disable the resistor.

6. The electric vehicle of any preceding clause, wherein the switch opens or closes to adjust the third voltage to match the fourth voltage.

7. The electric vehicle of any preceding clause, wherein the switch opens or closes according to a defined frequency.

8. The electric vehicle of any preceding clause, wherein the switch opens or closes according to a defined duty ratio.

9. The electric vehicle of any preceding clause, further comprising:
a first contactor and a second contactor, wherein the first contactor and second contactor close after the third voltage matches the fourth voltage.

10. The electric vehicle of clause 1 above with any set of combinations of electric vehicles 2-9 above.

11. An electric vehicle charging system, comprising:
an electric vehicle comprising a direct current to direct current (DC-DC) booster that boosts a first voltage to a second voltage of a battery of the electric vehicle, and a first insulation monitoring device (IMD) comprising an active symmetrization circuit; and
an electric vehicle supply equipment comprising a second IMD and an output voltage comprising the first voltage, wherein the first IMD is communicatively coupled to the second IMD, and wherein the first IMD adjusts a third voltage on a negative side of insulation resistance of the electric vehicle to a fourth voltage on a negative side of insulation resistance of the electric vehicle supply equipment.

12. The electric vehicle charging system of any preceding clause, wherein the second voltage of the battery is higher than the first voltage of the electric vehicle supply equipment, and wherein the output voltage of the electric vehicle supply equipment comprises a maximum output voltage of the electric vehicle supply equipment.

13. The electric vehicle charging system of any preceding clause, wherein the electric vehicle supply equipment comprises a maximum output voltage of 500 volts.

14. The electric vehicle charging system of any preceding clause, wherein the first IMD adjusts voltage sharing between a fifth voltage on a positive side of insulation resistance of the electric vehicle and the fourth voltage on the negative side of insulation resistance of the electric vehicle.

15. The electric vehicle charging system of any preceding clause, wherein the fifth voltage is increased and the fourth voltage is decreased to match the third voltage to the fourth voltage.

16. The electric vehicle charging system of clause 11 above with any set of combinations of electric vehicle charging systems 12-15 above.

17. A method, comprising:
determining, by an insulation monitoring device comprising a processor, of an electric vehicle, a difference between a voltage of a negative side of insulation resistance of an electric vehicle supply equipment (EVSE) and a voltage of a negative side of insulation resistance of the electric vehicle; and
in response to determining the difference, balancing, by the insulation monitoring device, the voltage of the negative side of insulation resistance of the EVSE and the voltage of the negative side of insulation resistance of the electric vehicle.

18. The method of any preceding clause, wherein the balancing comprising periodically opening and closing, by the insulation monitoring device, a switch that closes or opens to enable or disable a resistor of the insulation monitoring device.

19. The method of any preceding clause, wherein the switch opens or closes according to a defined frequency.

20. The method of any preceding clause, wherein the switch opens or closes according to a defined duty ratio.

21. The method of any preceding clause, further comprising:
in response to the voltage of the negative side of insulation resistance of the EVSE and the voltage of the negative side of insulation resistance of the electric vehicle, closing, by the insulation monitoring device, a pair of contactors between the electric vehicle and the EVSE.

22. The method of any preceding clause, wherein the insulation monitoring device is a first insulation monitoring device, and wherein the first insulation monitoring device receives data representative of the voltage of the negative side of insulation resistance of the EVSE from a second insulation monitoring device of the EVSE.

23. The method of clause 17 above with any set of combinations of methods 18-22 above.

What is claimed is:

1. An electric vehicle, comprising:
a non-isolated direct current to direct current (DC-DC) booster that boosts a first voltage of a charging station to a second voltage of a battery of the electric vehicle;
a first insulation monitoring device (IMD) comprising an active symmetrization circuit, a resistor, a switch that closes or opens to enable or disable the resistor, and a first contactor on a positive connection and a second contactor on a negative connection (126),
wherein the first IMD is communicatively coupled to a second IMD of the charging station through the first contactor and the second contactor, and receives data indicative of a fourth voltage on a negative side of insulation resistance of the charging station from the second IMD,
wherein the first IMD adjusts a third voltage on a negative side of insulation resistance of the electric vehicle to the fourth voltage by opening or closing the switch, and
wherein the first contactor and the second contactor close after the third voltage matches the fourth voltage.

2. The electric vehicle of claim 1, wherein the first IMD and the second IMD communicate according to a defined charging standard.

3. The electric vehicle of claim 1, wherein the first IMD further comprises a voltage sensor that measures the third voltage.

4. The electric vehicle of claim 1, wherein the switch opens or closes according to a defined frequency.

5. The electric vehicle of claim 1, wherein the switch opens or closes according to a defined duty ratio.

6. The electric vehicle of claim 1, wherein the first IMD determines a difference between the third voltage and the fourth voltage.

7. The electric vehicle of claim 6, wherein the first IMD, in response to determining the difference, balances the third voltage to the fourth voltage by opening or closing the switch, wherein the first contactor and second contactor close after the third voltage matches the fourth voltage.

8. The electric vehicle of claim 7, wherein the balancing comprising periodically opening and closing the switch that closes or opens to enable or disable the resistor.

9. The electric vehicle of claim 1, wherein the first IMD adjusts voltage sharing between a fifth voltage on a positive side of insulation resistance of the electric vehicle and the fourth voltage on the negative side of insulation resistance of the electric vehicle.

10. The electric vehicle of claim 9, wherein the fifth voltage is increased and the fourth voltage is decreased to match the third voltage to the fourth voltage.

11. The electric vehicle of claim 9, wherein the first voltage is 800 volts.

12. The electric vehicle of claim 9, wherein the second voltage is 400 volts.

13. A method, comprising:
providing a non-isolated direct current to direct current (DC-DC) booster that boosts a first voltage of a charging station to a second voltage of a battery of an electric vehicle;
providing a first contactor on a positive connection and a second contactor on a negative connection;
coupling a first insulation monitoring device (IMD) of the electric vehicle to a second IMD of the charging station through the first contactor and the second contactor, the first IMD comprising a processor, an active symmetrization circuit, a resistor, and a switch that closes or opens to enable or disable the resistor;
determining, by the first IMD a difference between a third voltage of a negative side of insulation resistance of an electric vehicle supply equipment (EVSE) and a fourth voltage of a negative side of insulation resistance of the electric vehicle received from the second IMD; and
in response to determining the difference, balancing the third voltage to the fourth voltage by opening or closing the switch by the first IMD, wherein the first contactor and second contactor close after the third voltage matches the fourth voltage.

14. The method of claim 13, wherein the balancing comprising periodically opening and closing, by the first IMD, the switch that closes or opens to enable or disable the resistor of the insulation monitoring device.

15. The method of claim 13, wherein the switch opens or closes according to a defined frequency.

16. The method of claim 13, wherein the switch opens or closes according to a defined duty ratio.

17. The method of claim 13, wherein the first IMD and the second IMD communicate according to a defined charging standard.

18. The method of claim 13, wherein the first IMD further comprises a voltage sensor that measures the third voltage.

19. The method of claim 13, wherein the first IMD adjusts voltage sharing between a fifth voltage on a positive side of insulation resistance of the electric vehicle and the fourth voltage on the negative side of insulation resistance of the electric vehicle.

20. The method of claim 19, wherein the fifth voltage is increased and the fourth voltage is decreased to match the third voltage to the fourth voltage.

* * * * *